United States Patent
Limb

(10) Patent No.: US 10,026,651 B1
(45) Date of Patent: Jul. 17, 2018

(54) SINGULATION OF ION-EXCHANGED SUBSTRATES

(71) Applicant: Palo Alto Research Center Incorporated, Palo Alto, CA (US)

(72) Inventor: Scott J. Limb, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 15/629,506

(22) Filed: Jun. 21, 2017

(51) Int. Cl.
| | |
|---|---|
| *H01L 21/301* | (2006.01) |
| *H01L 21/78* | (2006.01) |
| *H01L 23/00* | (2006.01) |
| *H01L 21/228* | (2006.01) |
| *C03C 21/00* | (2006.01) |
| *H01L 21/02* | (2006.01) |

(52) U.S. Cl.
CPC ............ *H01L 21/78* (2013.01); *C03C 21/002* (2013.01); *H01L 21/228* (2013.01); *H01L 23/57* (2013.01); *H01L 21/0243* (2013.01)

(58) Field of Classification Search
CPC .................................................. H01L 21/0243
USPC ......................................... 438/462; 148/33.2
See application file for complete search history.

(56) References Cited

U.S. PATENT DOCUMENTS

| | | | |
|---|---|---|---|
| 3,397,278 A | 8/1968 | Pomerantz | |
| 3,666,967 A | 5/1972 | Keister et al. | |
| 3,882,323 A | 5/1975 | Smolker | |
| 4,102,664 A | 7/1978 | Dumbaugh, Jr. | |
| 4,598,274 A | 7/1986 | Holmes | |
| 5,374,564 A | 12/1994 | Bruel | |
| 7,002,517 B2 | 2/2006 | Noujeim | |
| 7,153,758 B2 | 12/2006 | Hata et al. | |
| 7,554,085 B2 | 6/2009 | Lee | |
| 8,130,072 B2 | 3/2012 | De Bruyker et al. | |
| 9,154,138 B2 | 10/2015 | Limb et al. | |
| 9,294,098 B2 | 3/2016 | Shah et al. | |
| 9,356,603 B2 | 5/2016 | Limb et al. | |
| 9,577,047 B2 | 2/2017 | Chua et al. | |
| 9,780,044 B2 | 10/2017 | Limb et al. | |
| 2004/0222500 A1 | 11/2004 | Aspar et al. | |
| 2005/0176573 A1* | 8/2005 | Thoma ...................... C03C 3/16 501/69 |
| 2006/0270190 A1 | 11/2006 | Nastasi et al. | |
| 2007/0113886 A1 | 5/2007 | Arao et al. | |
| 2008/0029195 A1 | 2/2008 | Lu | |
| 2008/0311686 A1 | 12/2008 | Morral et al. | |

(Continued)

FOREIGN PATENT DOCUMENTS

| | | |
|---|---|---|
| DE | 102004015546 | 10/2005 |
| WO | WO200143228 | 6/2001 |

OTHER PUBLICATIONS

File History for U.S. Appl. No. 14/796,440.

(Continued)

*Primary Examiner* — George Fourson, III
(74) *Attorney, Agent, or Firm* — Hollingsworth Davis, LLC

(57) ABSTRACT

A method of making a substrate involves patterning the substrate into active areas and dicing lanes. After the substrate is patterned one or more stress layers are formed the substrate. A change in stress along a thickness of the substrate in the active areas is larger than a change in stress along the thickness of the substrate in the dicing lanes. The substrate is subsequently diced along the dicing lanes.

17 Claims, 14 Drawing Sheets

(56) References Cited

U.S. PATENT DOCUMENTS

| | | |
|---|---|---|
| 2009/0086170 A1 | 4/2009 | El Ghoroury et al. |
| 2010/0225380 A1 | 9/2010 | Hsu et al. |
| 2011/0048756 A1 | 3/2011 | Shi et al. |
| 2011/0183116 A1* | 7/2011 | Hung ............... B24B 7/241 428/156 |
| 2012/0135177 A1* | 5/2012 | Cornejo ............. B26F 3/002 428/43 |
| 2012/0135195 A1* | 5/2012 | Glaesemann ....... B23K 26/073 428/156 |
| 2012/0196071 A1* | 8/2012 | Cornejo ............. B28D 1/00 428/43 |
| 2012/0288676 A1* | 11/2012 | Sondergard ......... C03C 14/004 428/141 |
| 2013/0037308 A1* | 2/2013 | Wang ............... C03C 17/34 174/250 |
| 2013/0140649 A1 | 6/2013 | Rogers et al. |
| 2013/0192305 A1* | 8/2013 | Black ............... C03B 33/0222 65/30.14 |
| 2014/0103957 A1 | 4/2014 | Fritz et al. |
| 2014/0266946 A1 | 9/2014 | Billy et al. |
| 2014/0300520 A1 | 10/2014 | Nguyen et al. |
| 2014/0323968 A1 | 10/2014 | Rogers et al. |
| 2015/0044445 A1 | 2/2015 | Garner et al. |
| 2015/0089977 A1 | 4/2015 | Li |
| 2015/0102852 A1 | 4/2015 | Limb et al. |
| 2015/0229028 A1 | 8/2015 | Billy et al. |
| 2015/0318618 A1 | 11/2015 | Chen et al. |
| 2015/0372389 A1 | 12/2015 | Chen et al. |
| 2016/0137548 A1* | 5/2016 | Cabral, Jr. .............. C03C 15/00 430/325 |
| 2017/0036942 A1 | 2/2017 | Abramov et al. |

OTHER PUBLICATIONS

EP Search Report dated Jan. 4, 2018 for EP App. No. 17182800.7, 14 pages.
File History for U.S. Appl. No. 15/220,164.
File History for U.S. Appl. No. 15/220,221, 140 pages.
EP Search Report for EP App. No. 17182802.3 dated Dec. 6, 2017, 9 pages.

* cited by examiner

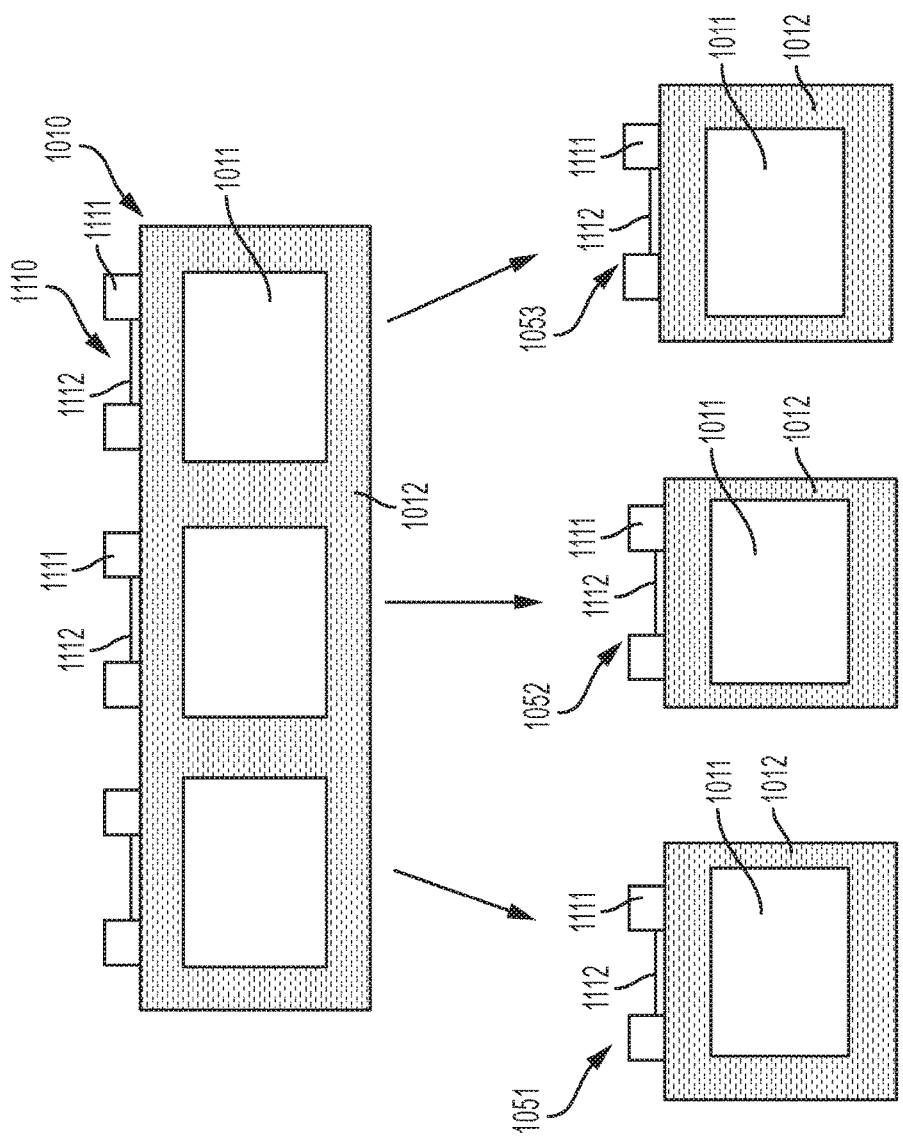

SINGULATION OF ION-EXCHANGED SUBSTRATES

TECHNICAL FIELD

This application relates generally to processes for fabrication of stress engineered substrates and to devices and systems that include such substrates.

BACKGROUND

It can be difficult to singulate stress engineered substrates because the stored stress in the substrate is released during the singulating process which causes the substrate to shatter. Generally, a stress-engineered substrate is pre-cut to the final dimension and processed to produce stressed layers in the substrate before components are disposed on the substrate. However, individually processing single substrates is more expensive than batch processing a larger substrate. Thus, an approach is needed that allows the substrate to be singulated after stress layers have been formed and components have been disposed on the substrate.

SUMMARY

Some embodiments are directed to a method of making a glass substrate that can be singulated into individual substrates. A glass substrate is patterned to include active areas and dicing lanes. After the glass substrate is patterned, the glass substrate is placed into a bath containing an ion solution wherein ion exchange takes place in the glass substrate. Ions in the ion solution are exchanged with ions in the glass. The ion exchange produces a non-uniform stress profile along a thickness of the glass substrate in the active areas. The change in stress along the thickness direction through the substrate in the active areas is greater than a change in stress as a function of distance along the thickness direction in the dicing lanes. The stress profile along a thickness of the glass substrate in the active areas may change sign from negative (compressive) to positive (tensile) or from positive to negative. The stress profile in the dicing lanes may not include a change in stress from compressive to tensile, or vice versa, and is more uniform compared to the stress profile in the active areas.

Some embodiments are directed to a subassembly comprising a glass substrate having one or both of ion-exchanged active areas and dicing lanes. The active areas have a stress profile along a thickness of the substrate such that the stress in the active areas changes by more than about 30% along the thickness of the substrate. The dicing lanes have a stress profile along a thickness of the substrate such that the stress in the dicing lanes changes by less than about 30% along the thickness of the substrate.

Some embodiments involve a singulated glass substrate comprising ion exchanged active areas. Dicing lanes are disposed along a perimeter of the glass substrate. The active have a stress profile along a thickness of the substrate such that the stress in the active areas changes by more than about 50% along the thickness of the substrate. The dicing lanes have a stress profile along a thickness of the substrate such that the stress in the dicing lanes changes by less than about 50% along the thickness of the substrate. Electrical circuitry is disposed on the surface of the glass substrate.

BRIEF DESCRIPTION OF THE DRAWINGS

FIG. 11 illustrates a process of singulating substrates having components disposed thereon in accordance with some embodiments.

The figures are not necessarily to scale. Like numbers used in the figures refer to like components. However, it will be understood that the use of a number to refer to a component in a given figure is not intended to limit the component in another figure labeled with the same number.

DESCRIPTION

Transient systems can disaggregate and disperse either after a period of time or in response to a trigger mechanism. One example of a transient system comprises one or more components, e.g., electronic devices, disposed on a stress engineered substrate. For example, the stress engineered substrate may be ion-exchanged glass substrate having a first surface and a second surface. The ion-exchanged glass substrate has a stress profile along the thickness direction of the substrate such that the stress within the substrate changes (is non-uniform) with respect to distance along the thickness direction. In response to a trigger mechanism, the substrate and the components disposed thereon shatter into small pieces due to the stored stress in the substrate. When fabricating transient systems such as these, it is cost effective to form thin film devices for multiple systems on the stress engineered substrate before the substrate is singulated into multiple separate systems. However, dicing the substrate is problematic because dicing the ion-exchanged glass initiates propagating cracks that cause the substrate and components disposed thereon to self-destruct. Embodiments disclosed herein are directed to approaches for singulating a stress engineered substrate with reduced cracking during the dicing process.

Ion exchanged substrates have a non-uniform stress profile along the thickness direction of the substrate due to one or more layers under compressive stress and/or one or more layers under tensile stress. For example, an ion exchanged substrate may include one or more compressively stressed layers disposed at or near one or both surfaces of the substrate. The ion-exchanged substrate may include one or more layers under tensile stress disposed nearer to the center of the substrate. The tensile stress of the inner layers balances the compressive stress of the outer layers. On method of forming ion-exchanged substrates involves immersing a sodium glass substrate into a molten salt solution that includes larger ions, e.g., potassium ions. The larger ions in the solution migrate into the glass surface, replacing the smaller ions originally in the glass. As the glass cools, the larger ions create a compressively stressed layer that forms a tough surface. Other methods for forming ion-exchange substrates are also possible.

Figure 1A:
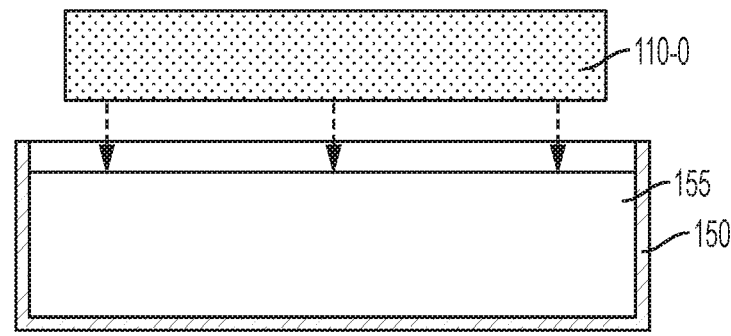
FIGS. 1A through 1E are cross sectional diagrams that illustrate a process of forming a stress engineered glass substrate having a stress profile through the thickness direction of the substrate in accordance with some embodiments.
Figure 1B:
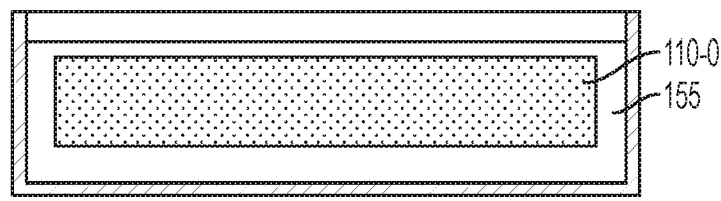
Figure 1C:
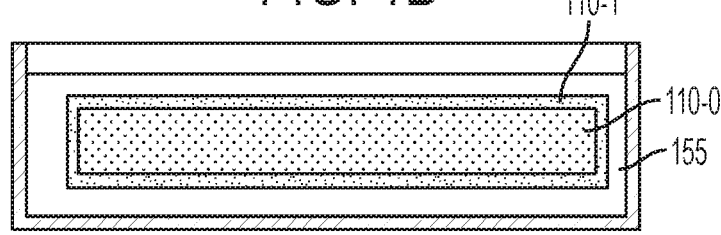
Figure 1D:
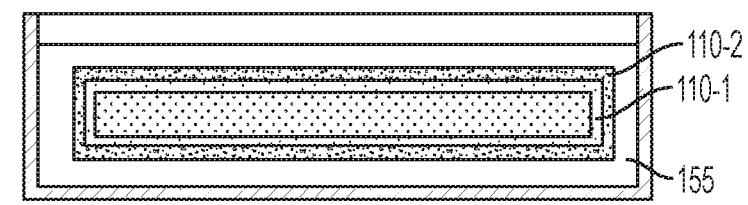
Figure 1E:

FIGS. 1A through 1E illustrate a process of forming a stress engineered substrate having one or more stress layers that create a non-uniform stress profile through the thickness direction of the substrate. The stressed substrate 110 shown in FIGS. 1A through 1E may be produced by subjecting a core substrate to an ion-exchange tempering treatment during which various stress profiles can be introduced in a core substrate via molten-salt ion exchange. FIG. 1A shows a core substrate 110-0 over a vat 150 containing a molten-salt solution 155. FIG. 1B shows core substrate 110-0 immediately after submersion in molten-salt solution 155, FIG. 1C shows core substrate 110-0 after a first time period of submersion in molten-salt solution 155 in which a first stress-engineered layer 110-1 is formed, and FIG. 1D shows the structure after a second time period of submersion in molten-salt solution 155 in which a second stress-engineered layer 110-2 is formed on first stress-engineered layer 110-1. FIG. 1E shows completed stressed substrate 110 including central core substrate 110-0 and stress-engineered layers 110-1 and 110-2.

Figure 2A:
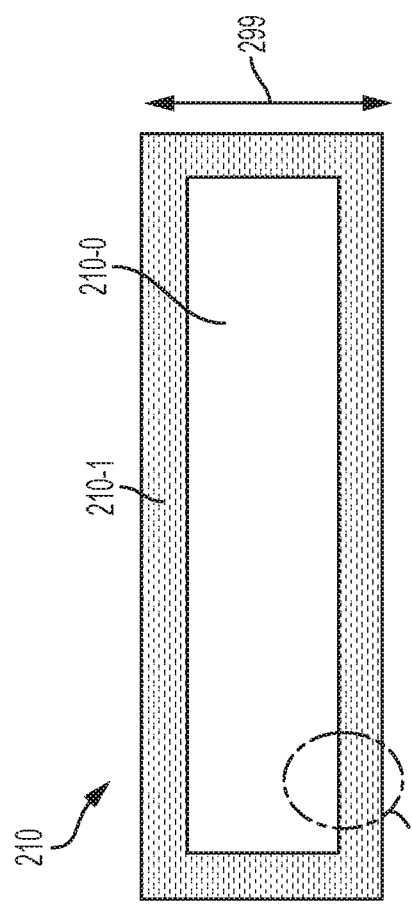
FIG. 2A is a cross sectional view of a substrate having stress engineered layers in accordance with some embodiments.
Figure 2B:
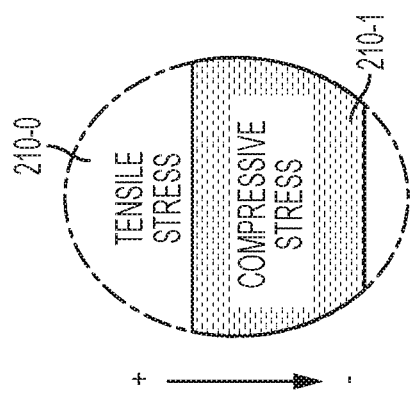
FIG. 2B is a close up view of a portion of the substrate of FIG. 2A showing the stress profile along the thickness direction in accordance with some embodiments.

FIGS. 2A and 2B illustrate the stress engineered layers that form a non-uniform stress profile in an ion exchanged substrate along the thickness direction 299 of the substrate. FIG. 2A shows a substrate 210 having a tensile stress layer 210-0 and a compressive stress layer 210-1. FIG. 2B is a close up of a portion of the cross section of FIG. 2A showing the stress gradient in the substrate 210 including a tensile stress layer (+ stress) and a compressive stress layer (− stress) through the thickness of the portion of the substrate.

Embodiments disclosed herein involve forming dicing lanes that have a more uniform stress profile. For example, the stress profile in the dicing lanes is more uniform than the stress profile in the active areas and in some embodiments, the stress profile is substantially uniform. The stress profile in the dicing lanes has a gradient that is insufficient to generate propagating cracks that cause the substrate to self-destruct. The substrate includes active areas having a non-uniform stress profile such that a trigger, e.g., heat or impact, initiates crack propagation leading to the self-destruction of the substrate. Self-destruction of the substrate can involve fragmentation or powderization of the substrate into small pieces, e.g., small particles such that most particles have length, width, and height dimensions of less than about 900 µm, less than about 500 µm, or even less than about 100 µm. The stress profile of the substrate in the active areas is such that the stress through the thickness direction of the substrate changes sign, e.g., from compressive stress (negative sign) to tensile stress (positive sign). The stress profile of the substrate in the dicing lanes is such that the stress through the thickness direction of the substrate does not change sign and/or is substantially uniform. The stress through the thickness of the substrate in the active areas may change by more than about 30%, more than about 50%, or even more than about 100% whereas the stress through the thickness of the substrate in the dicing lanes is more uniform and may change by less than about 50%, less than about 30% or even less than about 10%. The stress profile in the dicing lanes may be substantially uniform. Components and/or electronic circuitry may be formed on the active areas of the glass substrate. In some embodiments, at least one of the components comprises a trigger mechanism, e.g., a heater that initiates the self-destruction of the glass substrate.

The core glass substrate is singulated into multiple individual substrates along the dicing lanes. The stress profile of the substrate in the dicing lanes reduces the possibility that dicing the glass substrate along the dicing lanes will cause the substrate to shatter. For example, the stress profile in the dicing lanes may comprise substantially uniform stress. The stress in the dicing lanes may not change sign and/or the stress value may change by only a small amount along the thickness direction of the substrate.

Figure 3A:
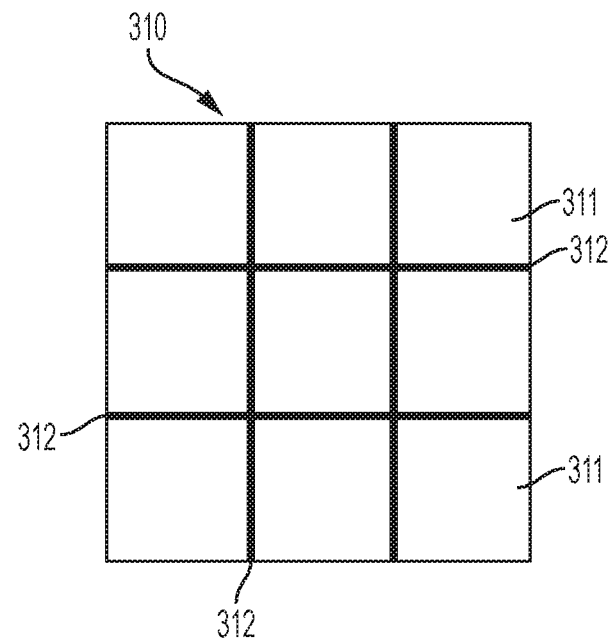
FIG. 3A is a top view of a substrate having multiple active areas and multiple dicing lanes in accordance with some embodiments.

FIG. 3A is a top view of a subassembly comprising a substrate 310 that includes nine active areas 311 separated by dicing lanes 312. The stress along the thickness direction of the substrate 310 in the active areas 311 changes by a larger amount in comparison to the stress along the thickness direction of the substrate in the dicing lanes 312. The active areas 311 can be any suitable size to support the components that will be formed thereon. The dicing lanes 312 extend substantially across the width and/or length of the substrate. Each dicing lane 312 may have a width of about 100 µm, or less, which is a suitable thickness for scribe cleaving. The width of the dicing lanes 312 may be at least about 60% of the thickness of the dicing lane. For example, if the thickness of the dicing lane is 500 µm then the dicing width may be at least 300 µm. Dicing lanes that are at least about 60% of the width of the thickness are suitable for saw dicing, for example.

In some embodiments, the substrate has been ion-exchanged in both the active areas and the dicing lanes. For example, the active areas may be ion exchanged to form layers of having different stress forming a non-uniform stress profile through the thickness of the substrate. The dicing lanes may be substantially completely ion-exchanged such that the stress profile in the dicing lanes is substantially uniform. In some embodiments, the substrate is only ion exchanged in the active areas and is not substantially ion-exchanged in the dicing lanes. The substrate 310 may be thinned in the dicing lanes. For example, the thickness of the substrate 310 in the dicing lanes 312 may be about 0.75, 0.5, or 0.25 times the thickness of the substrate 310 in the active areas 311. In some embodiments, the thinned dicing lanes may be fully ion exchanged along the thickness direction of the substrate 310.

Figure 3B:
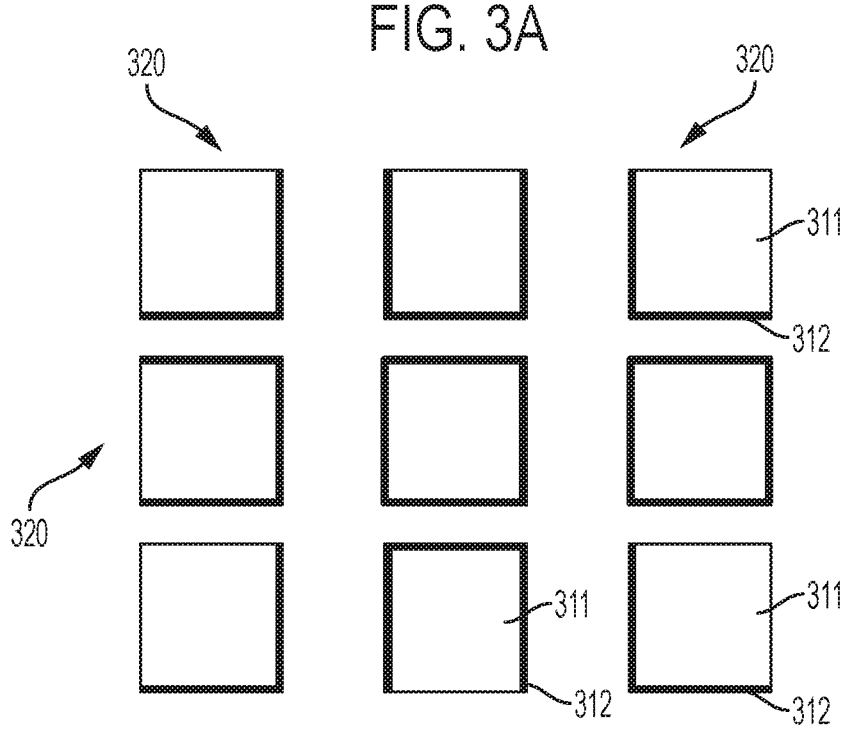
FIG. 3B is a top view of individual substrates that have been singulated along the dicing lanes in accordance with some embodiments.

FIG. 3B shows multiple individual subassemblies 320 formed after the substrate 310 is singulated. Each of the subassemblies 320 includes an active area 311 and a portion of a dicing lane 312 along at least a portion of the periphery of the subassembly 320.

Figure 4:
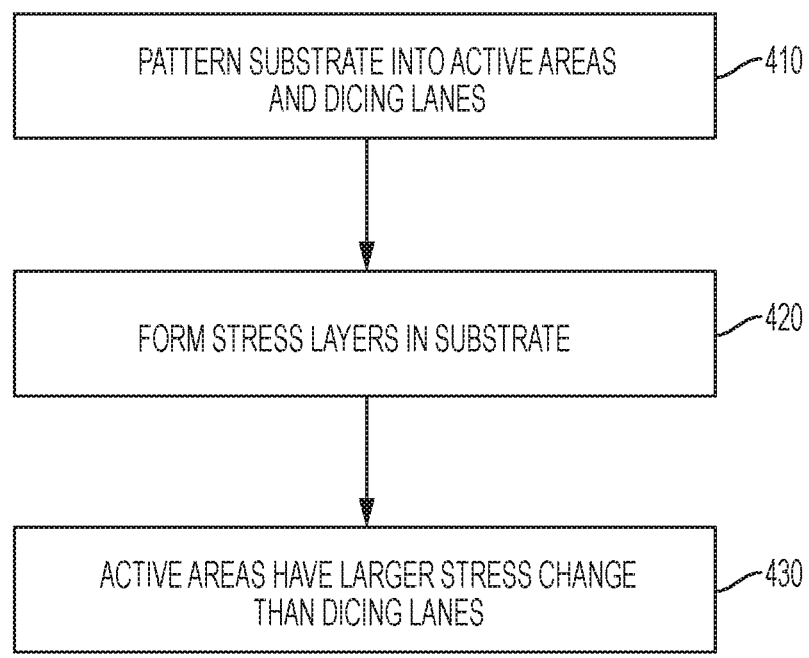
FIG. 4 is a flow diagram illustrating a process of making singulated glass substrates in accordance with some embodiments.

FIG. 4 is a flow diagram illustrating a method of forming the subassemblies 320 shown in FIG. 3B. A substrate is patterned 410 into active areas and dicing lanes. After the substrate is patterned, stress layers are formed 420. For example, in some embodiments forming the stress layers includes placing a glass substrate into an ion bath in which ions in the glass substrate are exchanged for ions in the ion bath. The stress layers produce 430 a non-uniform stress profile along a thickness of the glass substrate in the active areas. The stress profile in the active areas may change from compressive stress to tensile stress and/or from tensile stress to compressive stress. The change in the stress in the active areas along a thickness of the glass substrate is larger when compared to the change in stress (change in stress is also referred to as a stress gradient) along the thickness direction of the substrate in the dicing lanes. The stress in the dicing lanes may not change sign from compressive stress to tensile stress or vice versa. The dicing lanes may have a substantially uniform stress profile.

The stress in the dicing lanes may change by less than about 50% or less than about 30% or even less than about 10% through the thickness of the substrate. The stress profile in the active areas may change by than about 30%, or more than about 50%, or more than about 70%, or even more than about 100% through the thickness of the substrate. The percentage change in stress through the thickness of the substrate may be determined by calculating the difference between the highest stress value and the lowest stress value, dividing the difference by the lowest stress value, and multiplying by 100.

After the stress layers are formed, singulated glass substrates may be created by dicing the ion-exchanged glass substrate along the dicing lanes.

According to some embodiments, formation of the stress layers, e.g., by ion exchanging, can produce a stress gradient in the dicing lanes that is substantially less than the stress gradient in the active areas. For example, the stress gradient in the dicing lanes may be substantially zero.

Figure 5:
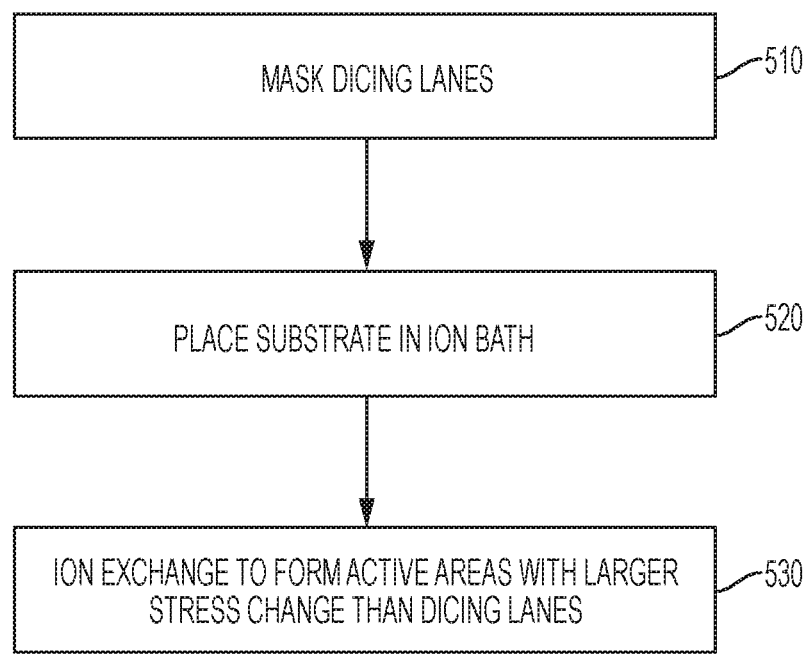
FIG. 5 is a flow diagram illustrating a process of making singulated glass substrates in accordance with some embodiments.
Figure 6A:
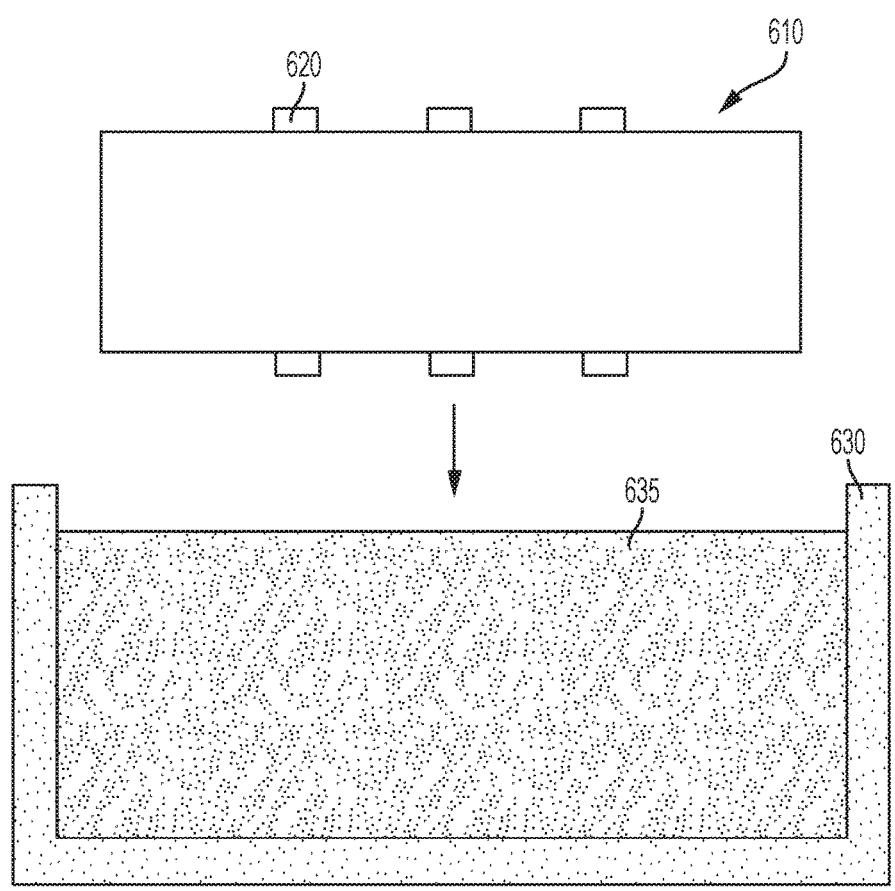
FIGS. 6A and 6B are cross sectional diagrams illustrating the process of FIG. 5.
Figure 6B:
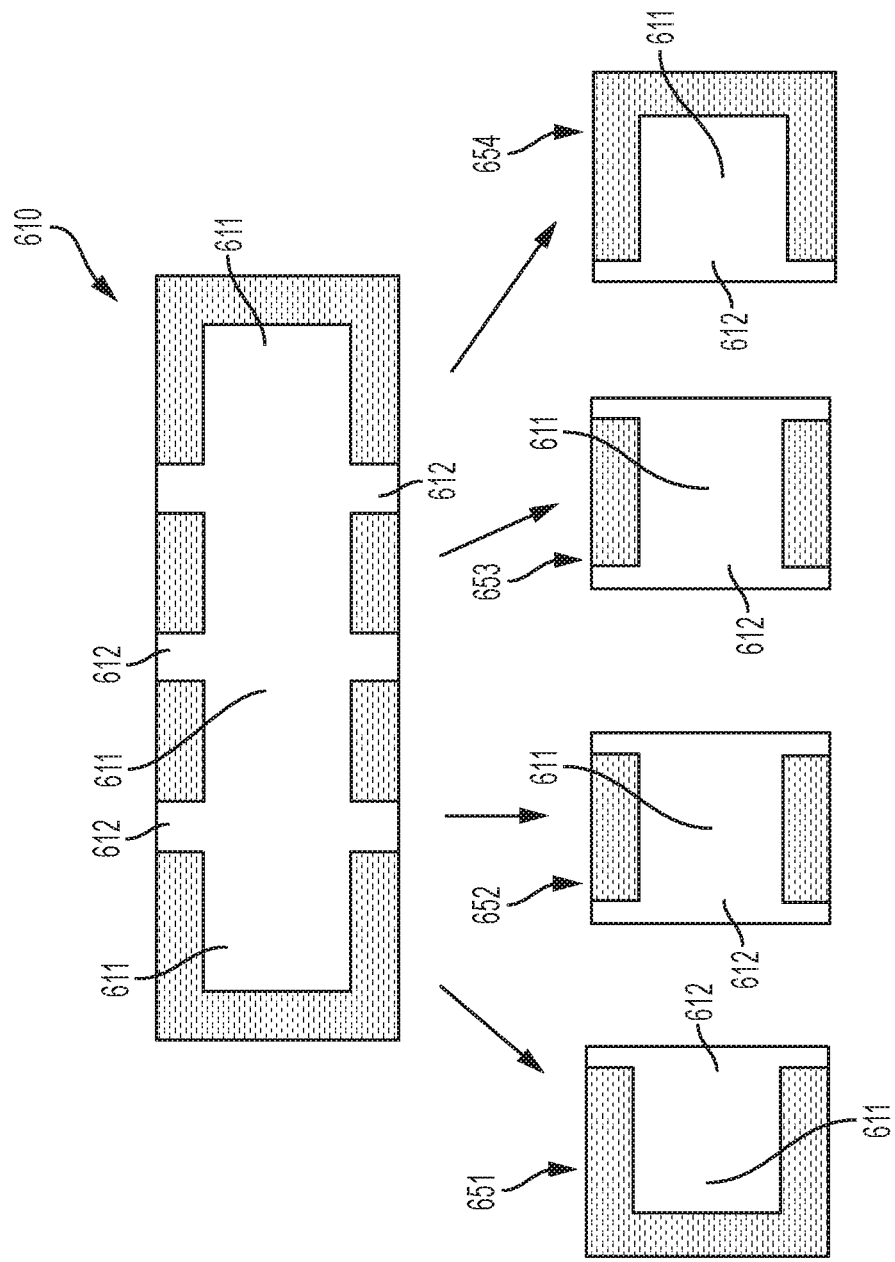

The flow diagram of FIG. 5 and the cross sectional diagrams of FIGS. 6A and 6B illustrate a method of forming singulated substrates in accordance with some embodiments. As illustrated in FIG. 5, in some embodiments patterning the substrate includes masking 510 the dicing lanes with a mask material that is impervious to the method used to form the stress layers, e.g., the ion exchanging process. FIG. 6A shows a glass substrate 610 with the mask material 620 disposed on the upper 610a and lower 610b surfaces of the substrate 610. The mask material 620 may be deposited on the surfaces 610a, 610b of the substrate 610 by photolithography, by printing, by screen printing, and/or by other suitable processes. After the mask material 620 is applied along the dicing lanes 611, the stress layers are formed. In the example depicted in FIGS. 5, 6A and 6B, the glass substrate is placed 520 in a bath 630 containing an ion solution 635. While the glass substrate is in the bath, ions in the ion solution 635 are exchanged 530 with ions in the unmasked active areas 611 of the substrate 610 until the desired stress profile along the thickness of the glass substrate 610 is created. The mask 620 prevents or significantly limits ion exchange in the dicing lanes 612. The substrate 610 remains in the ion solution 635 and the ion exchange continues the active areas 611 until the change in stress through the thickness direction in the active areas is substantially larger than the change in stress through the thickness direction in the dicing lanes 612.

The upper portion of FIG. 6B shows the glass substrate 610 after ion exchange and before singulation of the substrate. The lower portion of FIG. 6B shows four singulated substrates 651-654 after the glass substrate 610 is diced along the dicing lanes 612. Each of the singulated substrates 651-654 in this example includes and active area 611 and a portion of a dicing lane 612 located along at least part of the periphery of the singulated substrate 651-654.

Figure 7:
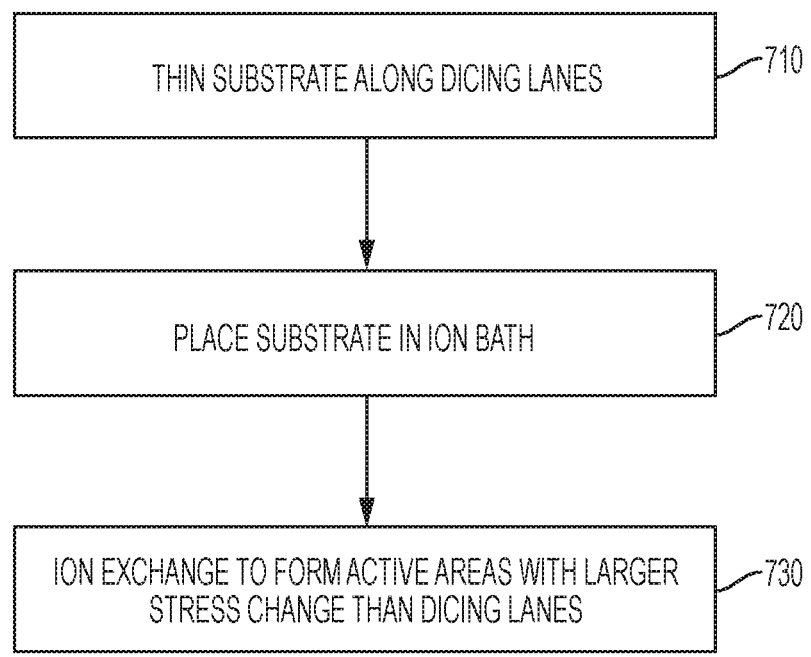
FIG. 7 is a flow diagram illustrating a process of making singulated glass substrates in accordance with some embodiments.
Figure 8A:
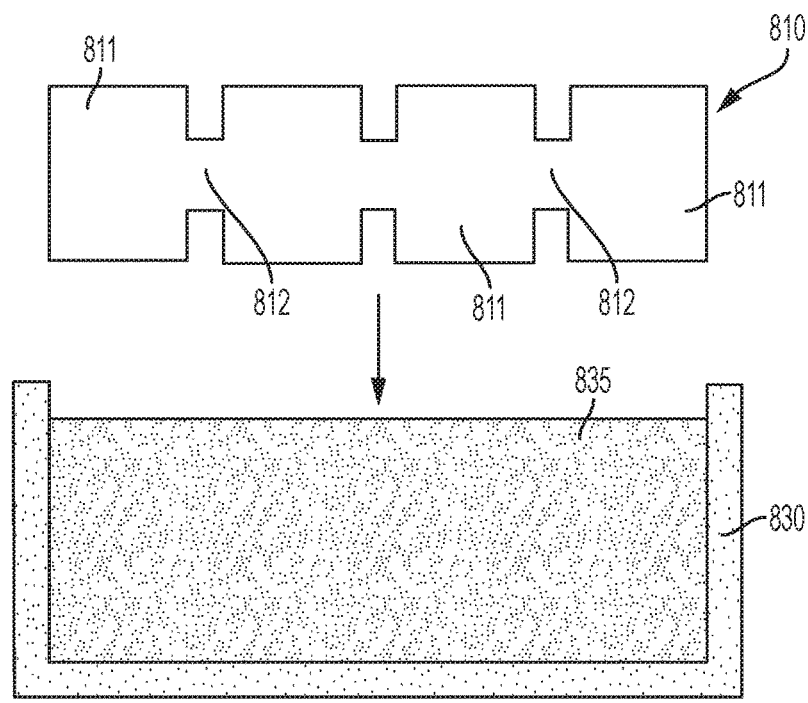
FIGS. 8A and 8B are cross sectional diagrams illustrating the process of FIG. 7.
Figure 8B:
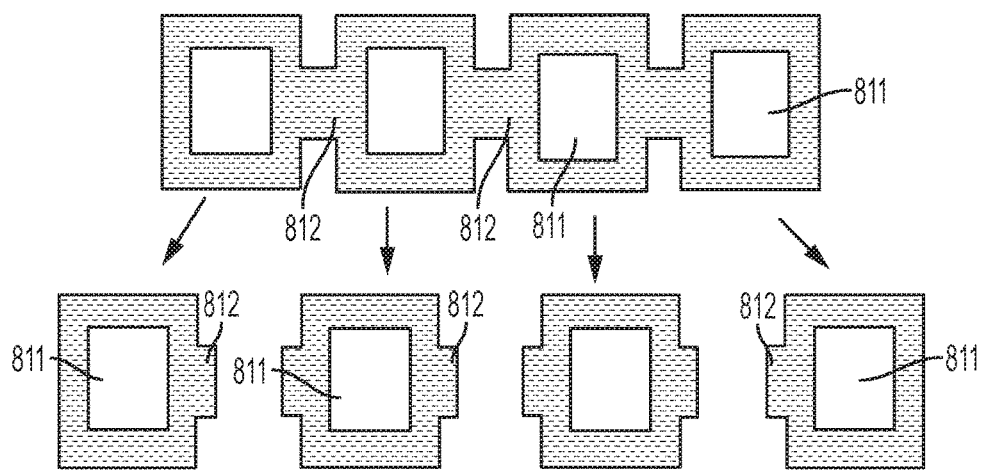

The flow diagram of FIG. 7 and the cross sectional diagrams of FIGS. 8A and 8B illustrate a method of forming singulated substrates in accordance with some embodiments. As illustrated in FIG. 7, in some embodiments patterning the substrate includes thinning 710 the substrate in the dicing lanes. For example, thinning the dicing lanes may be achieved by molding, laser thinning, etching, polishing and/or any other suitable method for thinning the substrate.

FIG. 8A shows a glass substrate 810 after the dicing lanes 812 have been thinned. For example, the thickness of the thinned dicing lanes 812 may be may be less than about 25% or less than about 50% of the thickness of the active areas 811 of the substrate 810. After the dicing lanes 812 are patterned by thinning, the substrate is placed 720 into the bath 830 containing an ion solution 835 where ion exchange occurs 730 in the active areas 811 and in the thinned dicing lanes 812. The ion exchange continues until the change in stress along the thickness direction of the substrate in the active areas is larger than the change in stress along the thickness direction of the substrate in the dicing lanes. The ion exchange may continue until ion exchange occurs in substantially all of the thickness of the substrate 810 in the thinned dicing lanes. The upper part of FIG. 8B shows the substrate 810 after ion exchange. The ion exchange has occurred in substantially all of the thickness of the thinned dicing lanes 812 in this example. The lower part of FIG. 8B shows singulated substrates 851-854 after the substrate 810 is diced along the dicing lanes. Each of the singulated substrates 851-854 includes an active area 811 and a portion of a dicing lane 812 at the periphery of the active area 811.

Figure 9:
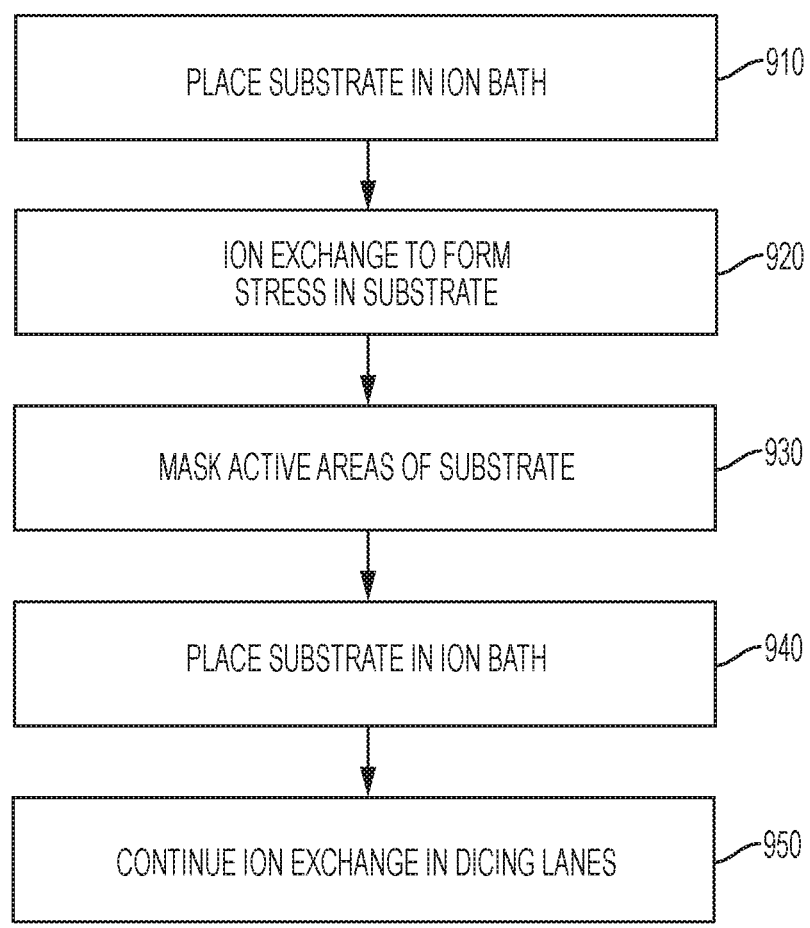
FIG. 9 is a flow diagram illustrating a process of making singulated glass substrates in accordance with some embodiments.
Figure 10A:
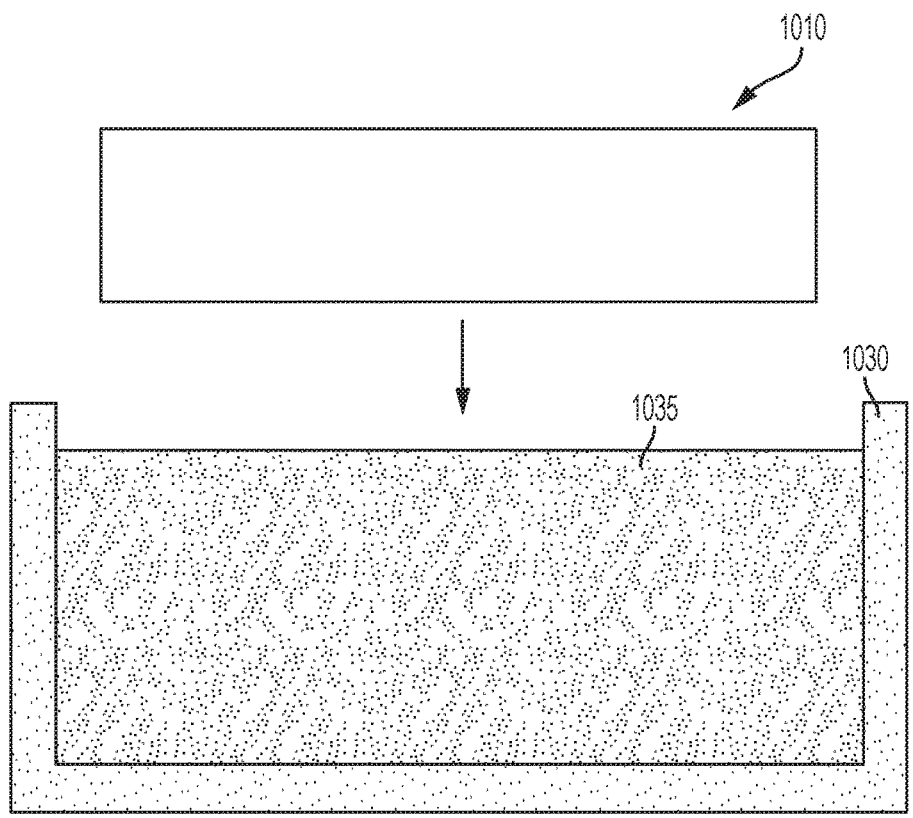
FIGS. 10A through 10D are cross sectional diagrams illustrating the process of FIG. 9.

The flow diagram of FIG. 9 and the cross sectional diagrams of FIGS. 10A through 10D illustrate a method of forming singulated substrates in accordance with some embodiments. As depicted in FIG. 10A, the substrate 1010 is placed 910 into an bath 1030 containing an ion solution 1035 wherein ion exchange occurs at the surface of the substrate 1010. The ion exchange forms 920 stress layers in the substrate providing a non-uniform stress profile through the thickness of the substrate 1010. In this scenario, the substrate is not masked or thinned and ion exchange occurs over the substrate surface.

Figure 10B:
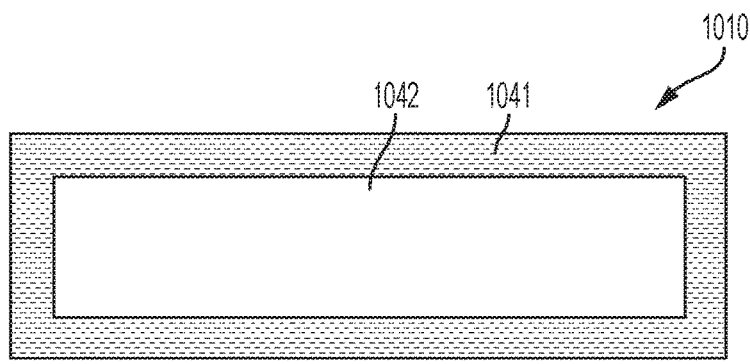

FIG. 10B shows the substrate 1010 after the initial ion exchange. The initial ion exchange creates a layer 1041 under compressive stress at the surface of the substrate 1010 and a layer 1042 under tensile stress that balances the compressive stress of layer 1041 as illustrated in FIG. 10B.

Figure 10C:
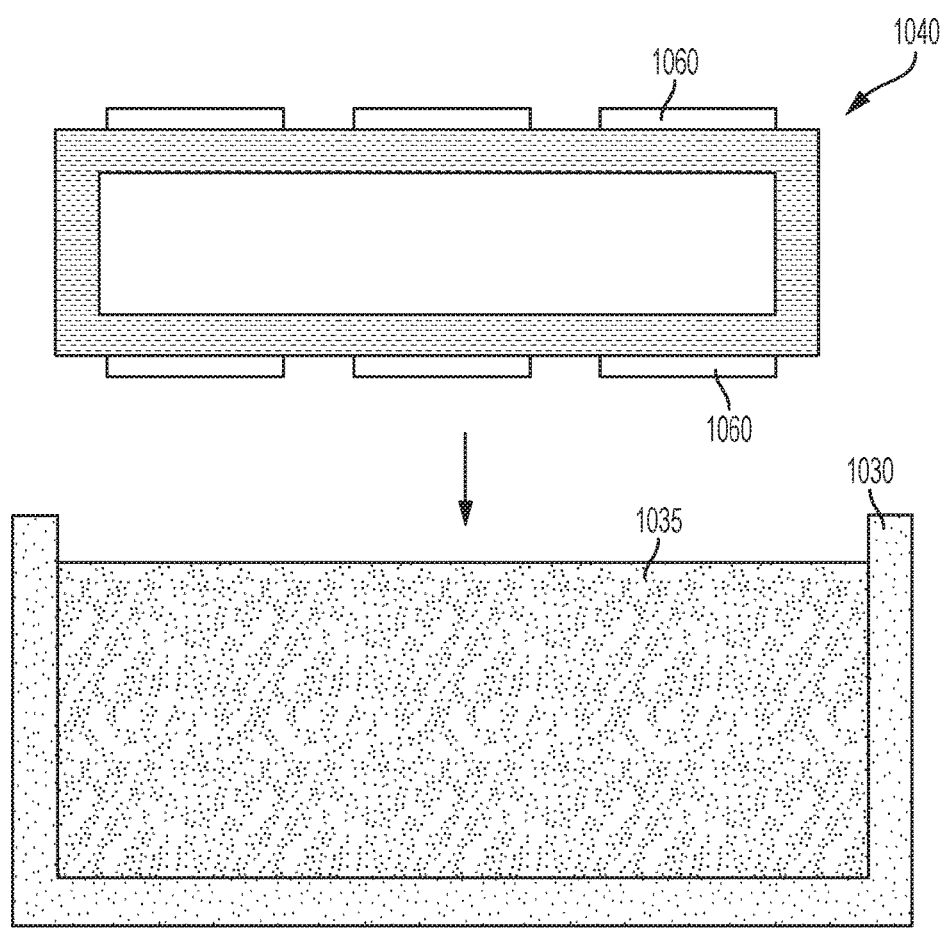
Figure 10D:
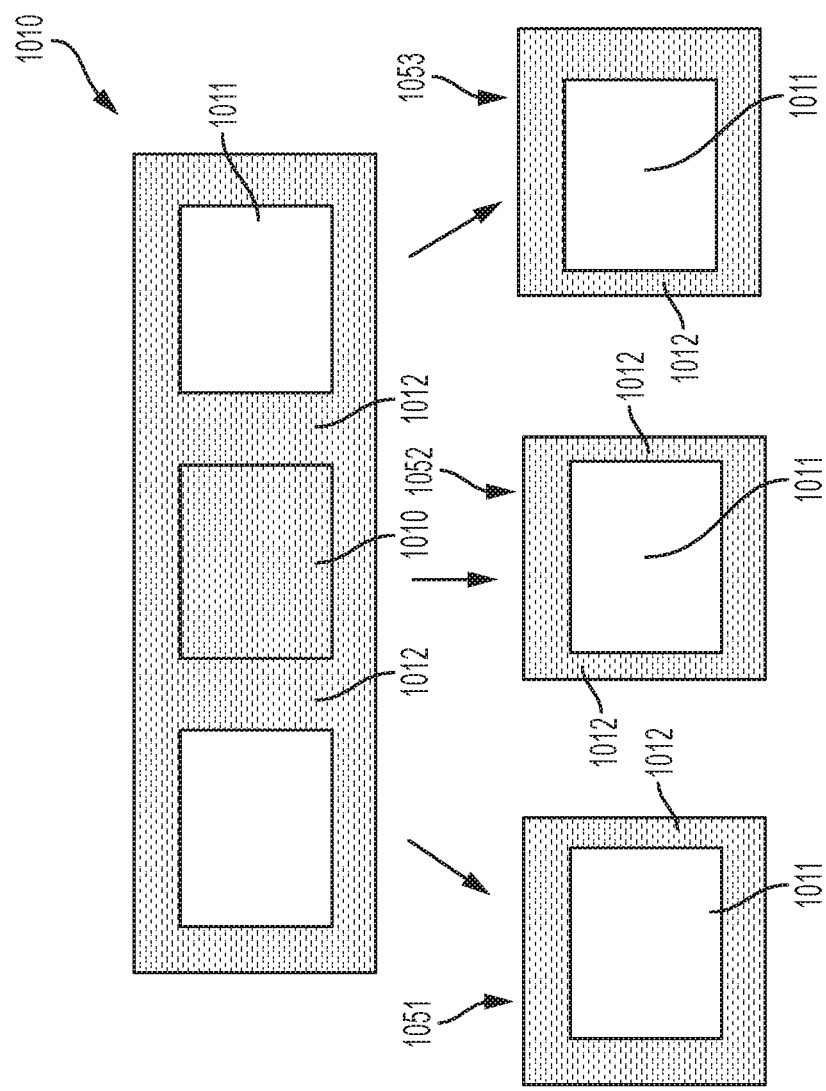

After the initial ion exchange process, the substrate 1010 is patterned 930 with mask material 1060 disposed over active areas 1011 of the substrate 1010 as depicted in FIG. 10C. After patterning, the substrate 1010 is again placed 940 in a bath 1030 of ion solution 1035 where a second ion exchange occurs 950 as shown in FIG. 10C. The mask material 1060 prevents or greatly reduces ion exchange in the active areas 1011 during a second ion bath. Ion exchange continues in the dicing lanes until the change in stress through the thickness direction in the dicing lanes 1012 is less than the change in stress through the thickness direction in the active areas 1011. The upper part of FIG. 10D shows the substrate 1010 after the ion exchange. The lower part of FIG. 10D shows singulated substrates 1051-1052 after substrate 1010 is diced along the dicing lanes 1012. Each singulated substrate 1051-1053 includes an active area 1011. The dicing lanes 1012 are present along at least a portion of the periphery of the singulated substrates 1051-1053.

In some embodiments, components are formed on the substrate before the substrate is singulated into individual substrates. The upper part of FIG. 11 shows a cross sectional view of the substrate 1010 as discussed in connection to FIGS. 9 and 10A through 10D. Components 1110, e.g., electronic components 11101 and interconnecting traces 1112 are formed on the surface of the active areas 1011 of the glass substrate after the dicing lanes 1012 are formed. After formation of the components 1110, the substrate 1010 is singulated into individual substrate 1051-1053. Each substrate 1051, 1052 includes components 1111, 1112 disposed on the surface of the active area 1011. At least one of the components 1112 may be part of a trigger mechanism that, when energized, causes the substrate to self-destruct by fracturing into small pieces.

A number of values and ranges are provided in various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various facets of the implementations. These materials are to be treated as exemplary, and are not intended to limit the scope of the claims.

The foregoing description of various embodiments has been presented for the purposes of illustration and description and not limitation. The embodiments disclosed are not intended to be exhaustive or to limit the possible implementations to the embodiments disclosed. Many modifications and variations are possible in radiation of the above teaching.

The invention claimed is:

1. A method comprising:
   patterning a substrate into active areas and dicing lanes;
   after patterning the substrate, forming one or more stress layers in the substrate, wherein a change in stress along a thickness of the substrate in the active areas is larger than a change in stress along the thickness of the substrate in the dicing lanes, and forming the stress layers extends through more than about 50% of the thickness of the dicing lanes.

2. The method of claim 1, wherein:
   patterning the substrate comprises patterning a glass substrate into the active areas and the dicing lanes;
   forming the stress layers comprises placing the glass substrate into an ion bath and forming an ion-exchanged layer in the glass substrate.

3. The method of claim 1, further comprising forming singulated substrates by dicing the substrate along the dicing lanes.

4. The method of claim 1, wherein the change in stress along the thickness of the substrate in the dicing lanes is substantially zero.

5. The method of claim 1, wherein:
   patterning the substrate into active areas and dicing lanes comprises masking the dicing lanes; and
   forming the stress layers comprises ion-exchanging ions in the substrate until the change in stress along the thickness of the substrate in the active areas is substantially larger than the change in stress along the thickness of the substrate in the dicing lanes.

6. A method comprising:
   patterning a substrate into active areas and dicing lanes; and
   after patterning the substrate, forming one or more stress layers in the substrate, wherein a change in stress along a thickness of the substrate in the active areas is larger than a change in stress along the thickness of the substrate in the dicing lanes; wherein:
   patterning the substrate into active areas and dicing lanes comprises thinning the substrate in the dicing lanes; and
   forming the stress layers comprises ion-exchanging ions in the active areas and in the dicing lanes until the change in stress along the thickness of the substrate in the active areas is substantially larger than the change in stress along the thickness of the substrate in the dicing lanes.

7. A subassembly comprising a substrate having active areas and dicing lanes wherein one or both of the active areas and the dicing lanes are ion exchanged and wherein the dicing lanes have a stress profile in which a change in stress along a thickness of the substrate is less than a change in stress along a thickness of the substrate in the active areas; wherein the dicing lanes comprise ion exchanged dicing lanes.

8. The subassembly of claim 7, wherein stress in the dicing lanes is substantially uniform.

9. The subassembly of claim 7, wherein the dicing lanes comprise non-ion exchanged dicing lanes.

10. The subassembly of claim 7, wherein a thickness of the substrate in the dicing lanes is less than a thickness of the substrate in the active areas.

11. The subassembly of claim 7, wherein the dicing lanes have a width of about 60% of the thickness of the dicing lanes.

12. The subassembly of claim 7, wherein the dicing lanes are disposed along a perimeter of the substrate.

13. The subassembly of claim 7, wherein the dicing lanes are disposed only along a perimeter of the substrate.

14. An assembly comprising:
   a substrate having an active area that includes one or more stressed layers and dicing lanes disposed at least along a perimeter of the substrate, a change in stress along a thickness of the substrate in the dicing lanes being less than a change in stress along the thickness of the substrate in the active areas; and
   electrical circuitry disposed on the surface of the substrate;
   wherein the electrical circuitry includes at least one component configured to initiate fracture of the substrate.

15. A method comprising:
   patterning a substrate into active areas and dicing lanes;
   after patterning the substrate, forming one or more stress layers in the substrate, wherein a change in stress along a thickness of the substrate in the active areas is larger than a change in stress along the thickness of the substrate in the dicing lanes;
   forming the one or more stress layers comprises placing the substrate into an ion bath and forming an ion-exchanged layer in the substrate; and
   the ion-exchanged layer extends through substantially all of the thickness of the dicing lanes.

16. A method comprising:
   patterning a substrate into active areas and dicing lanes;
   after patterning the substrate, forming one or more stress layers in the substrate, wherein a change in stress along a thickness of the substrate in the active areas is larger than a change in stress along the thickness of the substrate in the dicing lanes;
   placing the substrate into an initial ion bath before patterning the substrate; and ion-exchanging ions in the substrate including ion-exchanging ions in the dicing lanes; wherein:

patterning the substrate into active areas and dicing lanes comprises masking the active areas of the substrate and leaving the dicing lanes unmasked; and forming the stress layers comprises continuing to ion-exchange ions in the dicing lanes until the change in stress along the thickness of the substrate in the active areas is substantially larger than the change in stress along the thickness of the substrate in the dicing lanes.

17. The method of claim 6, wherein thinning the substrate comprises one or more of molding, laser thinning, etching, and polishing.

* * * * *

UNITED STATES PATENT AND TRADEMARK OFFICE
CERTIFICATE OF CORRECTION

| | | |
|---|---|---|
| PATENT NO. | : 10,026,651 B1 | Page 1 of 1 |
| APPLICATION NO. | : 15/629506 | |
| DATED | : July 17, 2018 | |
| INVENTOR(S) | : Scott J. Limb | |

It is certified that error appears in the above-identified patent and that said Letters Patent is hereby corrected as shown below:

In the Specification

Column 1, Line 4, insert:
--STATEMENT REGARDING FEDERALLY SPONSORED RESEARCH AND DEVELOPMENT
This invention was made with Government support under DARPA HR0011-16-C-0087 Only-dust.
The Government has certain rights in this invention.--

Signed and Sealed this
Twenty-third Day of July, 2019

Andrei Iancu
*Director of the United States Patent and Trademark Office*